United States Patent
Andrioletti et al.

(10) Patent No.: US 12,454,775 B2
(45) Date of Patent: Oct. 28, 2025

(54) PRINTED ELECTRONIC TEXTILE COMPONENT

(71) Applicant: PORCHER INDUSTRIES, Eclose-Badinières (FR)

(72) Inventors: Florence Andrioletti, Miribel (FR); Estelle Dalod, Pont de Cheruy (FR)

(73) Assignee: PORCHER INDUSTRIES, Eclose-Badinières (FR)

( * ) Notice: Subject to any disclaimer, the term of this patent is extended or adjusted under 35 U.S.C. 154(b) by 260 days.

(21) Appl. No.: 18/546,439

(22) PCT Filed: Feb. 18, 2022

(86) PCT No.: PCT/EP2022/054143
§ 371 (c)(1),
(2) Date: Aug. 15, 2023

(87) PCT Pub. No.: WO2022/175485
PCT Pub. Date: Aug. 25, 2022

(65) Prior Publication Data
US 2024/0301595 A1     Sep. 12, 2024

(30) Foreign Application Priority Data

Feb. 19, 2021 (FR) ...................................... 2101656

(51) Int. Cl.
| | | |
|---|---|---|
| *D03D 1/00* | (2006.01) | |
| *D03D 13/00* | (2006.01) | |
| *D03D 15/283* | (2021.01) | |
| *H05K 1/03* | (2006.01) | |

(52) U.S. Cl.
CPC ......... *D03D 1/0088* (2013.01); *D03D 13/008* (2013.01); *D03D 15/283* (2021.01); *H05K 1/038* (2013.01); *D10B 2401/18* (2013.01); *D10B 2403/0241* (2013.01); *D10B 2403/0243* (2013.01)

(58) Field of Classification Search
None
See application file for complete search history.

(56) References Cited

U.S. PATENT DOCUMENTS

| | | |
|---|---|---|
| 5,269,863 A | 12/1993 | Middelman |
| 8,003,198 B2 | 8/2011 | Park et al. |
| 10,231,623 B2 | 3/2019 | Varadan et al. |
| 10,390,428 B2 | 8/2019 | Wu et al. |
| 2009/0126974 A1 | 5/2009 | Yuasa et al. |
| 2009/0291604 A1 | 11/2009 | Park et al. |
| 2010/0075053 A1 | 3/2010 | Stremsdoerfer |
| 2010/0279086 A1 | 11/2010 | Park et al. |
| 2011/0155444 A1 | 6/2011 | Stremsdoerfer |
| 2011/0226629 A1 | 9/2011 | Stremsdoerfer et al. |
| 2014/0011004 A1 | 1/2014 | Sotzing et al. |
| 2017/0204519 A1 | 7/2017 | Kwag et al. |
| 2018/0030599 A1 | 2/2018 | Stremsdoerfer et al. |
| 2018/0305846 A1 | 10/2018 | Tachibana et al. |

FOREIGN PATENT DOCUMENTS

| | | |
|---|---|---|
| EP | 0478051 | 4/1992 |
| EP | 3 442 309 | 6/2021 |
| WO | WO 2009/94572 | 7/2009 |

OTHER PUBLICATIONS

International Search Report for PCT/EP2022/054143 dated May 27, 2022.
Preliminary Search Report for FR 2101656 dated Oct. 27, 2021.

*Primary Examiner* — Arti Singh-Pandey
(74) *Attorney, Agent, or Firm* — Aaron Schulman, Esq.; Stites & Harbison, PLLC

(57) ABSTRACT

The drapable electronic component comprises a protective layer formed of a textile and a protective polymer layer coating one side of the textile, an electronic layer deposited on the textile on the other side of the textile and formed by printing a conductive, semiconductor or dielectric ink; the textile is a fabric obtained by weaving continuous yarns, it has a cover factor CF25 higher than or equal to 0.5, CF25=(number of filaments/cm×diameter of 1 filament in cm)$_{warp}$+(number of filaments/cm×diameter of 1 filament in cm)$_{weft}$ over 25 μm thickness of said textile, the textile having a thickness of between 25 and 400 μm.

24 Claims, No Drawings

PRINTED ELECTRONIC TEXTILE COMPONENT

The present invention relates to a component having electronic functionalities and which in particular is lightweight, durable and drapable.

EP 3 442 309 describes an electrically conductive, flexible, planar textile element comprising a conductive ink print obtained by applying, by screen printing, an aqueous polymer dispersion containing electrically conductive particles onto a textile surface that is previously smoothed either by hot calendering or by application of a thermoplastic polymer and hot calendering, although this solution is criticized therein. This polymer is selected from among polyesters, polyamides, polyolefins, polyurethanes, PVC, polyacrylonitrile, polyvinyl alcohol. The textile carrier layer can be most diverse such as a canvas, knit, woven fabric or fleece. The document indicates a weight for this layer that is less than or equal to 250 g/m2, in particular from 20 to 150 g/m2, preferably from 40 to 100 g/m2. The list of textile structures able to be used, such as weight per unit surface area, does not include effective consideration given to the issue of producing an element that is lightweight, drapable and durable It is one objective of the invention to provide a textile having electronic functionalities, which in particular is lightweight, drapable and particularly durable, in particular being mechanically and chemically resistant to internal and external environmental stresses, and in particular to the presence of water and/or organic solvents and/or ambient humidity and/or oxygen in air.

It is one particular objective of the invention to propose said textile which does not require pre-treatment of the initial textile structure before inking, such as smoothing by calendering or the application of a primary polymer layer, whilst allowing the printing of very precise, durable patterns.

Other objectives of the invention will become apparent on reading the remainder hereof.

The compromise between durability, lightness and drapability is difficult to obtain. Nevertheless, the invention proposes a component having electronic functionalities. In particular, this component is lightweight, durable, and drapable. A drapable electronic component is a surface electronic component which is sufficiently flexible and deformable to cover an object of volumetric shape by best following the contours of this volumetric shape to obtain draping of said object. However, the drapable electronic component is not necessarily used to cover an object and can have diverse applications. The component is durable in that that the printed ink having electronic functionality, in particular conducting functionality, is protected against mechanical stresses and environmental or weather stresses and in particular against humidity and oxygen to ensure a long lifetime of the component. Metals such as conducting metals (with the exception of gold) react to water, oxygen and/or sulfur. Conducting metals therefore have a tendency to degrade over time into semiconductors, becoming much less efficient for transporting electricity. Silver in particular is subject to the effects of oxidation especially in humid climates.

The component of the invention therefore comprises an electronic circuit layer and a protective layer. One idea at the root of the invention is to make provision so that the protective layer is both a protective layer and a carrier layer, but the electronic circuit layer should be in direct contact with the textile. The idea is to avoid the inter-positioning of a primary layer (polymer for example) or smoothing treatment e.g. by calendering which are solutions possibly having harmful consequences on the mechanical strength of the textile by crushing and damaging the fibres, and possibly having harmful consequences on adhesive force and durability between the ink and a textile surface that is calendered or coated with a thermoplastic polymer, for example on account of physicochemical incompatibility.

The protective layer therefore forms a complex which comprises a textile and a protective polymer layer coating one side of the textile, while the electronic circuit layer is deposited on the side of the textile opposite the side on which the protective polymer layer is coated. The electronic circuit layer (or electronic layer) is therefore formed directly on the textile. The electronic circuit layer is advantageously formed by adapted ink printing.

In the following description, excepting examples, isolated numerical values or within a range cover the indicated values stricto sensu as well as the surrounding values that persons skilled in the art will consider to be included in the indicated numerical value.

The textile is a fabric obtained by weaving continuous yarns. The characteristics given below are those of the fabric after weaving, without the structural modifications imposed by post-weaving treatment such as calendering.

The textile has a thickness of between 25 and 500 µm, in particular between 25 and 300 µm, more particularly between 25 and 150 µm, and further particularly between 25 and 50, 60 or 70 µm.

The textile is characterized by a cover factor CF over a thickness of 25 µm greater than or equal to 0.5, typically of 0.5 to 3, in particular between 0.6 and 2.5, more particularly between 0.7 and 2, further particularly between 0.7 and 1.5, the CF25 value being calculated as follows: CF25=[(number of filaments/cm×diameter of 1 filament in cm)$_{warp}$+(number of filaments/cm×diameter of 1 filament in cm)$_{weft}$]×25/Thickness of the textile measured in µm. By number of filaments per cm, it is meant the number of constituent filaments of the warp and weft yarns.

In one embodiment, very fine fabrics are used, particularly having a thickness lying within the following ranges: 25 to 70 µm, 25 to 60 µm, 25 to 50 µm. For these very fine fabrics, the fabric can be characterized by the overall cover factor thereof CF, in addition to or instead of CF25. This CF is in particular greater than or equal to 1.5, in particular, between 1.5 and 3, preferably between 1.8 and 3, the CF being calculated as follows: CF=(number of filaments/cm× diameter of 1 filament in cm)$_{warp}$+(number of filaments/cm×diameter of 1 filament in cm)$_{weft}$.

Measurements of the thickness of fabrics are conducted using a micrometer following standard NF EN ISO 5084, with a pressure-foot circular surface area of 2 cm$^2$ and pressure-foot pressure of 500 g/cm$^2$.

According to one characteristic of the invention, the fabric is not calendered.

The weight of the fabric can be between 20 and 450 g/m$^2$, in particular between 20 and 350 g/m$^2$, typically between 20 and 250 g/m$^2$, in particular between 20 and 100 g/m$^2$.

If the fabric is produced with synthetic yarns (e.g. polyamide, polyester), the number of yarns per cm for the warp and weft is in particular between 10 à 50 yarns/cm, for example 20 or 30 to 50 yarns/cm.

If the fabric is produced with inorganic yarns (e.g. glass, basalt), or of natural origin (e.g. cellulose and derivates, flax) the number of yarns per cm for the warp and weft is between 6 and 30, in particular between 8 and 30, and more particularly between 10 and 25 yarns/cm.

The textile has a structure that is both scarcely thick and very dense, leading to a planar surface condition suitable for precise and durable printing of conductive ink. It is therefore easily possible to obtain a printed electronic layer in the form of pattern with particularly high resolution i.e. composed of surfaces or elements of very precise dimensions and/or particularly fine and complex. The drapable electronic component can therefore have high resolution or highly precise fabrication, depending on applications, for the capture, transmission of electronic and in particular electric signals, or for the formation of electronic especially electric surface circuits.

In addition, the protective layer combines said textile and a polymer layer, this combination additionally allowing the imparting not only of the desired drapability, but also of the mechanical strength of the printed electronic component permitting the ensured durability of the component having mechanical strength, and in particular resistance to mechanical wear and tear, and chemical resistance in particular imperviousness to water, humidity, air, dust and oxygen. The printed electronic layer is therefore well protected against external mechanical stresses and external environmental pollution, and in particular oxidation phenomena. Additionally, the polymer layer imparts the protective layer with better resistance translated by the fact that the protective layer is less deformable than at the time of production thereof including at the time of ink printing on the opposite side, which first allows homogeneous well-delimited tracks to be obtained having very good electronic properties e.g. conductivity, and secondly allows fabrication of the component with continuous process for example of roll-to-roll type. The protective layer also contributes electrical insulation of the component by preventing the diffusion of electric charges through the protective layer.

Electrical conductivity characterizes the ability of a material to allow the free passing of electric charges and hence the passing of an electric current. Electrical conductivity is the reverse of resistivity. This resistivity corresponds to the resistance of a material one metre in length and having a cross-section of one square metre. It is expressed in ohm-metres or ohm-centimetres ($\Omega m$ or $\Omega cm$). Changes in resistivity can vary as a function of temperature, and are dependent on the type of material. Metals (copper, gold, silver, aluminium,) have lower resistivity values at ambient temperature, lower than $10^{-5}$ $\Omega cm$. Materials having a resistivity higher than $10^8$ $\Omega cm$ are considered to be insulating (such as glass, mica, silica). For semiconductor materials, resistivity is between $10^{-3}$ $\Omega cm$ and $10^4$ $\Omega cm$.

The drapable electronic component is preferably obtained using a production method including fabrication of the protective layer via deposition of the polymer on a first side of a textile, drying and crosslinking this polymer, followed by sole printing of the ink on the other side of the textile. The protective layer promotes deposition of ink on the opposite side, the protective layer having greater resistance than the fabric alone. If permitted by the fabric, on account of the good resistance thereof at the time of printing, it is also possible first to start by printing and then to deposit the polymer. Preferably, this printing is performed by screen printing ink onto the textile, or by offset technology.

A further subject of the invention is this method of fabrication and the product obtained with this method.

The Polymer Layer:

The weight of the protective layer (textile and protective polymer) can be between about 21 and about 700 $g/m^2$, typically between about 21 and 500 $g/m^2$, in particular between about 21 and about 320 $g/m^2$, more particularly between about 21 and about 130 $g/m^2$.

The dry take-up rate of the protective polymer can notably be between 5 and 50%, preferably between 5 and 30% by weight, better still between 10 and 30%. The dry take-up rate is the ratio by weight between the dry protective polymer and the textile.

The protective polymer layer can be composed of or can comprise a coating which coats or impregnates the textile, the polymer able to be deposited in particular on the surface of the dedicated textile by a doctor blade, or by other deposition techniques not applying mechanical action on the fabric likely to cause significant modification of the structure thereof. It can also be formed of an added film laminated onto the textile.

In the first case, when the polymer coats the textile, this polymer can notably comprise or be composed of: polyurethane, polyester, polycarbonate, polyether, polyethylene, polypropylene, polyvinyl alcohol, polyvinyl acetate, polyethylene vinyl acetate, poly(acrylate-methacrylate), polyvinyl chloride, synthetic rubber, silicone, copolymers of these polymers.

In one particular embodiment, the polymer is a polyurethane (PU), and this PU can advantageously be polyether- polyester- or polycarbonate-based.

In one particularly preferred embodiment, the polyurethane is a crosslinked polyether-polyester- or polycarbonate-based PU, and this PU is derived from the crosslinking (1) of a one component polyurethane elastomer having a modulus at 100% elongation lower than or equal to 50 MPa, typically between 1 and 50 MPa, in particular between 1 and 40 MPa, more particularly between 1 and 35 MPa, according to standard DIN 53504 conducted in an organic solvent phase (2) with a crosslinker in a proportion of dry crosslinker relative to dry elastomer of between about 5 and about 100% by weight, in particular between about 7 and about 80% by weight, in particular between about 8 and about 75% by weight.

A polyurethane comprises a stiff part (isocyanate) and a flexible part (polyol). Persons skilled in the art are able to find a compromise between the isocyanate/polyol ratio and the type of components to obtain an elastomer of desired stiffness, characterized by the modulus at 100% elongation. Preferably, the elastomer included in the protective polymer layer is one component, the isocyanate having reacted on the polyol, then with the chain extender or crosslinking agent to form an elastomer generally still comprising reactive functions of NCO and alcohol type. Persons skilled in the art can refer to the literature for the production of copolymer or elastomers obtained from isocyanate, polyol and chain extenders or crosslinking agent, in particular to the thesis on polymer materials: Thèse en Matériaux Polymères et Composites by Ségolène Hibon, INSA de Lyon, France, 2006.

The coating composition is preferably completed by a crosslinker, in particular an isocyanate or a melamine, or a mixture of both. By isocyanate, it is meant both an isocyanate and a polyisocyanate, alone or in a mixture with one or more other isocyanates and/or polyisocyanates. The term "isocyanate" is to be understood herein as grouping together the terms "isocyanate" and "polyisocyanate". Polyisocyanates are preferred. Regarding melamine, this can be melamine properly so-called (1,3,5-triazine-2,4,6-triamine) or a compound or a resin containing melamine, for example a melamine-formaldehyde resin.

In one embodiment, the polyurethane (and starting elastomer) is polyether-based. In particular the polyether-based polyurethane is linear or branched and comprises a polyol part of polyether type and an isocyanate part.

In another embodiment, the polyurethane (and starting elastomer) is polyester-based. In particular the polyester-based polyurethane is linear or branched and comprises a polyol part of polyester type and an isocyanate part.

In another embodiment, the polyurethane (and starting elastomer) is polycarbonate-based. In particular, the polycarbonate-based polyurethane is linear or branched and comprises a polyol part of polycarbonate type and an isocyanate part.

Regarding the elastomer and crosslinker, the isocyanate part is preferably aliphatic, since aromatic isocyanates particularly have the disadvantage of yellowing over time, making them less preferred even if still usable.

In one preferred embodiment, the protective layer is obtained by coating polyurethane in a solvent phase. The coating step of a polymer according to the invention is performed using techniques conventionally used for coating textiles, such as direct coating. By «direct coating» it is meant coating via direct deposition, for example using a doctor blade, cylinder, air knife, padding, Meyer rod (or Champion method).

In particular, a starting one component elastomer is used, or formed (formed in particular from the isocyanate, polyol and chain extender or crosslinking agent), in solution in a solvent. A film is formed naturally on evaporation of the solvent, and this film can be formed in contact with the fabric in the embodiment in which the fabric is coated or impregnated.

The polymer solvent is an organic solvent and can particularly be selected from the group formed by aromatic solvents, alcohols, ketones, esters, dimethylformamide and n-methylpyrrolidone. In one particular embodiment, the solvent is selected from the group formed by toluene, xylene, isopropanol, butanol, 1-methoxypropane-2-ol, methyl ethyl ketone, acetone, butanone, ethyl acetate, dimethylformamide, n-methylpyrrolidone, and a mixture of at least two thereof. For example, a mixture of toluene and isopropanol.

In one embodiment, the polyurethane solvent phase can be characterized by a concentration of between 20 and 50% by weight of non-crosslinked PU, in particular one component elastomer, relative to the PU/solvent mixture. In one embodiment, this polyurethane solvent phase, in particular the elastomer in solution in the solvent, can be characterized by viscosity of less than 100 000 mPa·s at 23° C., preferably of between 5 000 and 60 000 mPa·s at 23° C. (DIN EN ISO/A3 standard).

The polymer, similar to the PU, is dried and crosslinked in contact with the fabric. In particular the drying and crosslinking step first comprises drying e.g. at a temperature of between about 90 and about 120° C., followed by crosslinking at a temperature of between about 140 and about 210° C.

The fabric coating composition of the invention may also comprise additives. Said additives can be any additive routinely employed in fabric coating compositions. They are selected in particular from the group formed by viscosity modifiers, UV stabilizers, colouring agents and dispersants.

In one embodiment, after drying and crosslinking, the method comprises one of more post-treatment steps imparting dirt-repellent and/or water repellent properties. By dirt-repellent treatment, it is meant treatment with anti-static and/or anti-tack products. By water-repellent treatment, it is meant treatment with fluorinated resins with or without crosslinker of the fluorinated resin for example an isocyanate. Water-repellent treatment is followed by a drying/crosslinking step. In one embodiment, the post-treatment is applied using any method known to persons skilled in the art and in particular by padding, coating, spraying or plasma treatment.

In another case, provision is made for the polymer layer to be formed by a polymer layer laminated onto the textile. In other words, the protective layer is a drapable laminate. Fabrication therefore includes a step at which, to form the protective layer, the non-coated (bare) textile and polymer film are superimposed, hot pressed or glued to obtain this complex.

This polymer film can notably comprise or be composed of: polyurethane, polyester, polycarbonate, polyether, polyethylene, polypropylene, polyvinyl chloride, polyvinyl fluoride, poly(acrylate-methacrylate).

In one embodiment, as polymer film laminated on the textile, films of polyurethane or polyester are used or polyurethane- or polyester-based films. By polyurethane-based film, it is meant a film which comprises at least one polymer comprising at least one urethane function, such films for example may comprise polyurethane and at least one other constituent, for example at least one other monomer or at least one other polymer, or may comprise at least one urethane function and at least one other constituent for example at least one other monomer or at least another polymer. These polyurethane-based films are generally copolymers.

Said polyurethane-based films are in particular copolymers of polyurethane with at least one other polymer, in particular of polyether and/or polyamide type. These copolymers are preferably block copolymers. As nonlimiting examples, mention can be made of polyurethane-polyether block copolymers, polyurethane-polyamide block copolymers, and polyurethane-polyether-polyamide block copolymers.

The polyurethane is preferably an aromatic or aliphatic polyether-, polycarbonate- or polyester-based polyurethane, preferably aliphatic. Therefore, the polyurethane comprises a polyol part of polyether or polycarbonate or polyester type, and a (linear or branched) aromatic or aliphatic isocyanate part. In one particular embodiment, the polyurethane is an aromatic polyether-based polyurethane. In another embodiment, the polyurethane is an aliphatic polyether-based polyurethane. In another embodiment, the polyurethane is an aliphatic polyester-based polyurethane.

As nonlimiting example, the thickness of a film for example a polyurethane or polyester film, is typically in the region of a few micrometres to a few tens of micrometres, for example between about 3 and about 200 μm, in particular between 3 and 100 μm, preferably between about 5 and about 60 μm. Advantageously, the weight of these films is between about 3 and about 200 g/m², preferably between about 5 and about 100 g/m², more particularly between about 10 and about 60 g/m².

The Textile

In one embodiment, the textile of the protective layer is a fabric obtained by weaving continuous yarns. Therefore the fabrication of the protective layer includes the providing of said fabric or the weaving of said fabric. The weave of the fabric is chosen to allow obtaining of the CF25 cover factor and/or overall CF mentioned previously. As weave type, plain weave or satin weave can be particularly chosen without however being limited thereto.

If the textile is a said fabric, the fabric considered before treatment (coating, lamination, ink printing) is characterized by the cover factor previously mentioned. This cover factor corresponds to values imparting a sufficiently closed configuration to the fabric to form a good surface condition for ink printing, not deteriorated by application of the polymer layer on the other side of the textile. At the same time, it allows limiting of the take-up rate of the polymer or allows the use of polymer films of narrow thickness, and the obtaining of highly flexible complexes and drapable electrical circuits.

The density can be the same in warp and weft direction, or it can differ.

Preferably, the yarns forming the fabric are multifilament. They are formed of multiple continuous filaments. The yarns can be in organic, natural, synthetic or artificial material, in particular polyamide and especially PA 6.6, or polyester and in particular PET, or non-conductive inorganic fibres, glass in particular (e.g. E-glass or S-glass).

In one embodiment, the fabric comprises warp yarns and weft yarns in synthetic material (e.g. polyester or polyamide). These yarns can have a titer (linear density) in dtex of between about 11 and about 800 dtex, typically between 11 et 300 dtex, in particular between about 22 and about 110 dtex, in particular between about 22 and about 78 dtex. The linear density of the constituent filaments (DPF or decitex per filament) is in particular between 1 and 4, preferably between 1.3 and 3.5 dtex.

In another embodiment, the fabric comprises warp yarns and weft yarns in inorganic material or in natural material. As inorganic material, particular mention can be made of glass and basalt. As natural material, particular mention is made of yarns in biosourced material e.g. flax or cellulose. The yarns particularly have a titer (linear density) of between about 2 and about 300 tex, typically between about 2 and about 100 tex, in particular between about 10 and about 90 tex, particularly between about 20 and about 80 tex. The linear density of the constituent filaments (TPF or tex per filament) is particularly between 0.05 and 0.2.

In one embodiment, the warp yarns and weft yarns have the same linear density and the same DPF or TPF.

In one particularly well suited embodiment, the fabric is formed of PET yarns. PET is composed of repeat units of ethylene terephthalate; however, variants comprising a minority quantity of other units are included in the scope of the invention, for example less than 10 mole %, in particular less than 5 mole % of other units per molecular chain of the polyester (for example, the comonomers to form these other units may comprise isophthalic acid, dicarboxylic naphthalene acids, adipic acid, hydroxybenzoic acids, diethylene glycol, propylene glycol, trimellitic acid and pentaerythritol).

Polyester yarns, PET in particular, are multifilament. They are formed of multiple continuous filaments. In one embodiment, the fabric comprises warp yarns and weft yarns which have a dtex number of between 11 and 44 dtex, for example between 11 and 33 dtex, notably with a DPF (decitex per filament) of between 1 and 4, preferably between 1.3 and 3.5.

In one embodiment, the warp yarns and weft yarns have the same linear density and the same DPF.

The PET yarns are multifilament. In particular they can have one, two or the three following characteristics: glass transition temperature: 60 to 90° C., preferably 70 to 80°; melting point: 240 to 270° C., preferably 250 to 260° C.; yield stress: 3 to 7 cN/dtex, preferably 6 to 7 cN/dtex. Preferably, the PET yarn has the three aforementioned characteristics.

The tenacity (or tensile strength) of PET and PA6.6 yarns is particularly higher than or equal to 6 cN/dtex, in particular between 6 and 7 cN/dtex. Elongation at break is higher than or equal to 20%, in particular between 20 and 30%. Tenacity and elongation at break are measured according to standard NF EN ISO 2062.

PET fibres or yarns having these characteristics are commercially available and/or can be custom produced.

The fabric can be sized or glued with adhesive before being incorporated in the protective layer. This sizing or gluing of the textile can be removed in particular by washing or heat treatment, to promote adhesion of the ink.

The fabric, for example the de-sized or de-glued fabric, can undergo treatment to promote adhering of the ink to the fabric. It is possible to improve bonding of the ink by previously applying a primer treatment to the de-sized fabric. It can be physical treatment or chemical treatment called bonding treatment. For example this treatment can be corona treatment or plasma treatment or chemical treatment allowing an increase in the surface energy of the textile to improve wetting of the textile by the ink. For example, this treatment can be corona treatment or plasma treatment or chemical treatment contributing functional groups able to react with some ink groups to form chemical bonds.

If the fabric is formed of yarns in organic material, it can advantageously undergo thermosetting. Thermosetting prevents shrinkage on drying of the ink. Thermosetting is performed at 160 to 180° C. for fabrics in polyamide fibre, and at 200 to 210° C. for fabrics in polyester fibre, the fabrics being tensed in the warp direction and weft direction in a static or continuous process. This thermosetting, by imparting better resistance, also promotes regular printing of ink, in particular in a roll-to-roll process.

The component of the invention may particularly have the following specifications:
- a total weight of between about 22 and about 1400 g/m$^2$, in particular between about 22 and about 620 g/m$^2$, in particular between about 22 and about 280 g/m$^2$; and/or
- a weight of the protective layer of between about 21 and about 700 g/m$^2$, in particular between about 21 and about 320 g/m$^2$, in particular between about 21 an about 130 g/m$^2$.

A component of weight and thickness in the upper range of the specifications has mechanical strength beyond expected values, conforming drapability and conforming flexibility for the envisaged applications. On the contrary, a component having a weight and thickness in the lower range of the specifications has conforming mechanical strength, drapability and flexibility beyond expectations for the envisaged applications. Durability is dependent on the intensity and bending angle of mechanical wear stresses on the electronic component when in use. For stresses of high intensity and low bending angle, a component having the weight and thickness in the upper range of specifications is preferred. For stresses of lesser intensity and high bending angle, a component having the weight and thickness in the lower range of specifications is preferred.

Ink:

The thickness of the deposited ink is between about 1 and 150 μm, in particular between 2 and 50 μm, preferably between 5 and 30 μm. The ink can be applied in a single layer or in several successively applied layers. The successive layers can be in one same material, or in different materials compatible with each other. The protective layer can be fully covered or the ink can form simple or complex geometric patterns on the protective layer.

In one particular embodiment, for a silver-based ink of viscosity 13000 mPa·s, deposited by screen printing, and in particular for a protective layer having a CF25 factor of 0.8, the maximum resolution in width of deposited ink i.e. the minimum width of the tracks can reach 1 mm, even 0.5 mm. The maximum resolution between two deposited ink tracks i.e. the minimum distance between two ink tracks can reach 1.5 mm, even 1 mm.

The inks may comprise a polymer or copolymer in solvent phase, for example a PU in solvent phase.

The ink is an ink which provides the desired electronic functionality. In particular, it can be a conductive ink, a semiconductor ink or a dielectric ink.

A conductive ink is an ink designed to conduct electricity as known per se. In one embodiment, the electric resistance is constant. In another embodiment, the electric resistance is piezoresistive: in this case the electric resistance varies by applying and/or varying a mechanical stress on the protective layer, for example a pressure. In another embodiment, the electric resistance is thermoresistive: in this case, the electric resistance varies as a function of the temperature of the protective layer.

Other applications exist and are known to skilled persons, and can be transposed onto the protective layer or the component of the invention.

For all these embodiments, the conductive ink may comprise conductive or electroactive particles such as organic or mineral metal particles, for example silver particles or silver-containing particles and/or copper particles or copper-containing particles and/or carbon particles or carbon-containing particles. The conductive ink may also comprise organic conductive or electroactive polymers, and/or organic-inorganic conductive or electroactive polymers.

In particular, the conductive materials are nano- or micro-metal particles, the semiconductor materials are metal oxides, organic polymers or inorganic semiconductors. The functional conductive inks are advantageously developed from metals such as copper or silver, from metal oxides, conductive polymers, organometallic compounds, graphene, carbon nanotubes.

Dielectric materials are in particular polymers in a solvent phase, thermosetting polymers or organic polymers, to which ceramics are added in the form of microparticles and/or nanoparticles.

The functional ink allows dispersing of conductive, semiconductor or dielectric materials to facilitate deposition thereof on a flexible substrate, in particular via evaporation of solvent. Provision is made so that the ink is able to change from a state in which the ink can be printed e.g. liquid, to a state in which said conductive ink is fixed onto the fabric then being in a solid state. Preferably the ink fixed onto the fabric is flexible, even elastic, and is sufficiently flexible to adapt to the positioning or to deformation of the drapable printed electronic component.

Further information on these inks can be found in Tseghai et al. *Integration of Conductive Materials with Textile Structures, an Overview*, 3 Dec. 2020, *Sensors* 2020, 20, 6910; doi:10.3390/s20236910.

Depositing of the ink can be carried out by any means such as by spraying or ink jet printing, selective spraying or through a mask, or by screen printing or using offset technology.

Deposition of the ink can also be obtained by transfer of the conductive ink pattern from a transfer substrate onto the fabric, the conductive ink previously being deposited on the transfer substrate via any printing means.

Printing of the conductive ink on the fabric is preferably performed by screen printing or offset.

To fix the ink after printing, depending on ink type, it is preferable to have recourse to a drying step of the ink, or crosslinking or polymerization of the ink by heating or ultraviolet radiation.

Optional Second Protective Layer

The electronic circuit layer, formed by printing ink onto the textile, can be coated with a second protective layer.

The second protective layer comprises or is composed of a polymer. The polymer coating can particularly comprise or be composed of: polyurethane, polyester, polycarbonate, polyether, polyethylene, polypropylene, polyvinyl alcohol, polyvinyl acetate, polyethylene vinyl acetate, poly(acrylate-methacrylate), polyvinyl chloride, synthetic rubber, silicone, copolymers of these polymers.

The polymer used for this second protective layer can be a polymer such as described for the first protective layer. In one embodiment, the same polymer is used for both layers.

As is the case for the first protective layer, use can be made of a polyether-, polyester- or polycarbonate-based polyurethane, and most particularly a PU derived from the crosslinking (1) of a one-component polyurethane elastomer having a modulus at 100% elongation less than or equal to 50 MPa, in particular between 1 and 40 MPa, in particular between 1 and 35 MPa, according to standard DIN 53504 implemented in an organic solvent phase (2) by a crosslinker, in a proportion of dry crosslinker relative to dry elastomer of between about 5% and about 100% by weight, in particular between about 7 and about 80% by weight, in particular between about 8 and about 75% by weight.

This second protective layer can be applied, then dried and crosslinked.

The second protective polymer layer can also be formed by a film laminated onto the textile, as also described for the first protective layer.

All the characteristics described for the polymer of the first protective layer are applicable to this second layer, without the need herein for repetition thereof.

Use

The component having drapable electronic functionality is particularly intended to be applied onto a substrate or object, preferably being oriented so that the ink lies on the substrate or object side, and the protective layer lies on the opposite side facing outwardly. The substrate can be a material substrate (e.g. equipment) or a living substate (e.g. human animal, vegetal).

The invention therefore also concerns a covering element comprising at least said drapable component, which is configured to cover a substrate or object at least partially, for example of the type described in the preceding paragraph.

The invention also concerns an object carrying said drapable component on the surface thereof, said component being applied onto a surface of the object with the electronic layer on the surface side.

The printing patterns of the ink allow the imparting of desired electronic or electrical properties for a given application, as is known per se.

It is therefore possible to use the electronic component of the invention for the resistive, capacitive or inductive effects hereof, such as sensors, actuators, antennas for data storage and transmission, electromagnetic shielding, as optronic component, as electrically conductive track for the use or the contacting of electronic components, in particular LED or OLED, for RFID or NFC chips, as electronic components in flexible photovoltaic films, as electronic components in flexible OLED applications, as alternative system for power savings.

For a wire connection or for secondary electronics embedded in the component, the drapable printed electronic component advantageously comprises an integrated connector designed to be removably connected with the wire connection or with a corresponding connector belonging to the secondary electronics, or with a connection wire of the electronics with the drapable electronic circuit, the electronic or electric signals transiting via these connectors.

The electronic component of the invention is lightweight, has high mechanical strength and strong durability, with barrier properties in particular against oxygen in air, humidity, and the presence of water, whilst remaining flexible and drapable. In addition, the protective layer provides the electrical component of the invention with electric charge barrier properties, hence electrical or electronic insulation.

The invention will now be described in more detail with examples of embodiment that are nonlimiting.

Methods and Measurements Employed in the Application (Characteristics of the Invention and Examples):

In the examples, and for defining of the invention, the following methods are used whilst others are mentioned elsewhere in this description.

The impact of coating on the electrical charge barrier property was assessed by the following method. The resistance of the printed tracks was evaluated using an ohmmeter placed in contact from one end to the other of the printed conductive ink track. The reference measurement is the one in direct contact with the ink, on the right side of the fabric. The component is then turned over to place the ohmmeter in indirect contact with the conductive tracks i.e. on the wrong side of the fabric (whether or not coated) perpendicular to the track ends. The multimeter used can be a Fluke-115 or another model having the following characteristics:

Absolute maximum resistance: 40MΩ
Resolution of resistance measurement: 100 mΩ
Measuring accuracy: ±0.9%+2 counts. For example, for 10 measured ohms, the accuracy is 0.3 ohms (0.09+0.2 i.e. 0.29 ohms i.e. 0.3 ohms).

The lower the measured electrical resistance, the higher the electrical conductivity.

The tear mechanical strength was measured in warp direction and in weft direction in accordance with standard NF EN ISO 13934-1: Textiles—Tensile properties of fabrics—Part 1: Determination of maximum force and elongation at maximum force using the strip method. The tensile tests were performed using: speed of movement of crossbar set at 100 mm/min and distance between the two clamping jaws set at 200 mm; pre-tension was 2N.

NF EN ISO 2062—Determination of single-strand breaking force and elongation at break using a constant rate of extension (CRE) tester, use of Method A of the standard.

Breaking force (centinewton unit—cN): maximum force developed to break the sample during tensile testing conducted up until rupture.
Elongation at break (%): increase in the length of the sample measured at time of break.
Tenacity (cN/tex): quotient of the breaking force expressed in cN divided by the linear density of the yarn expressed in dtex (1 tex=1 g per 1000 m length of yarn).

The test allows measurement of the breaking force and elongation at break of the sample, these being characteristic magnitudes of the yarn.

The yarn is placed between two clamping jaws spaced 500 mm apart. The apparatus (Dynamometer) draws the clamps away from each other at constant speed of movement of 500 mm/min and measures the force continuously applied. The force required to break the yarn is measured as well as the increase in length of the yarn at break.

The mean breaking force and mean elongation at break are the two data characterized by this test. Tenacity is calculated from the ratio between the breaking force and linear density.

The modulus at 100% elongation of the one component polyurethane elastomer is measured according to standard DIN 53504. The modulus is defined under 3.4 of the standard, «Spannungswerte». Measurement is performed on dumb-bell test pieces (Schulterstab) of S2 type, however with bar length $l_s$ of 55 mm and thickness of 200 µm. The equipment used is a dynamometer. The dumb-bell test piece is placed in the clamping grippers spaced apart by a length $L_0$ with the least possible pre-tension. The grippers are drawn apart at a constant velocity of 400 mm/min and the dynamometer measures the force applied as a function of elongation. The modulus or stress at 100% elongation in MPa is the ratio between the force measured at 100% elongation and the initial cross-sectional area of the test piece. This is described in paragraph 9.4 Spannungswerte of standard DIN 53504.

Permeability is, and was, measured when new and after ageing conforming to standard NFG 07111 or standard NF EN ISO 9237—Determination of the permeability of fabrics to air, the latter replacing the former but giving the same results. The sample is mounted on a circular sample holder. Aspiration is applied to set up a pressure drop of 2000 Pa which causes an air stream to pass through the sample. The velocity of this air stream is measured and expressed in $L/m^2/min$.

For ageing, the permeability of the fabric is also measured after hydrolysis. For this testing, the fabric is placed for 4 hours in a pressure cooker with water at operating temperature and pressure. Thereafter, a treatment of 1 h is applied whereby the fabric is left to fly in open air at high speed, the fabric being fixed onto an assembly of windmill type (4-vane assembly, the fabric being attached to the end of one of the vanes).

For ageing under UV and humidity (condensation), the reference standards are:
ISO 11507:2007 Paints and varnishes—Exposure of coatings to artificial weathering—Exposure to fluorescent UV lamps and water.
DIN EN 12224: Geotextiles and geotextile-related products-Determination of the resistance to weathering.

EXAMPLE 1: ILLUSTRATION OF THE ELECTRIC CHARGE BARRIER PROPERTY

This example compares the characteristics between a polyamide fabric, printed with a conductive ink on one side and coated with a polyurethane coating on the opposite side (component of the invention), and a (reference) polyamide fabric printed with conductive ink and not coated on the opposite side. In this example, the PU was deposited first on one side of the fabric, and cured, after which the ink was deposited on the other side.

The conductive ink was Electrodag-725A silver ink by Henkel. Five parallel tracks 250 m in length and 1 mm in width were printed by screen printing on both fabrics, the reference fabric and the component of the invention. The pitch or interline distance was 3 mm. The thickness of the conductive ink deposit was 12 µm. The theoretical value of ohmic resistance of the conductive ink for these dimensions is 0.015*(250/25/12)=7.8 Ohms.

The reference was a PA6.6 fabric having a thickness of about 70 μm. The tenacity of the PA6.6 yarn was 6.6 cN/dtex. Elongation at break was 26%.

The component of the invention was in the same PA6.6 fabric with a coated polyurethane protective layer obtained by coating a PU elastomer having a modulus at 100% elongation of 2 MPa and an isocyanate+melamine formaldehyde crosslinker. The proportion of dry crosslinker relative to the dry elastomer was 8.4%. The polyurethane was applied in a 50:50 mixture of toluene and isopropanol.

The PU was a one component aliphatic polycarbonate-based PU. Coating was carried out using a doctor blade and was followed by drying at 100° C., then crosslinking at 180° C.

TABLE 1

| | Reference | Component of the invention, Example 1 |
|---|---|---|
| Type of yarn | PA6.6 | PA6.6 |
| Titer (dtex) | 33 | 33 |
| DPF (dtex) | 2.5 | 2.5 |
| Diameter of a filament (μm) | 19 | 19 |
| Number of warp yarns × number of weft yarns (number/cm) | 44 × 45 | 44 × 45 |
| CF25 | 0.8 | 0.8 |
| PU coating weight (g/m2) | 0 | 5.9 |
| PU modulus at 100% elongation (MPa) | NA | 2 |
| % crosslinker (by dry weight) | NA | 8.4 |
| Weight of protective layer (g/m$^2$) | 33.0 | 38.7 |
| Warp mechanical tear strength (daN) | 3.0 | 3.7 |
| Weft mechanical tear strength (daN) | 2.3 | 4.2 |
| Permeability to air when new (L/m2/min) under 2000 Pa | >200 | 3 |
| Permeability to air after ageing (L/m2/min) under 2000 Pa | >200 | 48 |
| Mean electric resistance of the five tracks in direct contact (right-side of fabric) (printed side) (Ohm) | 16.1 ± 0.1 | 8.4 ± 0.2 |
| Mean electric resistance of the five tracks in indirect contact (wrong-side of fabric) (non-printed side) (Ohm) | 16.8 ± 0.2 | No signal detected |

The measurement of mean resistance performed on the coated side of the coated fabric was zero, demonstrating the insulating and protective nature of the coating. In addition, the value of resistance on the printed side was lower for the coated fabric of the invention than for the non-coated reference fabric. It is therefore ascertained that the coating allows the contributing of a charge barrier property. Without wishing to bound by any theory, it is also thought that the protective layer, no doubt by improving the dimensional stability of the fabric, and the resistance of the protective layer, improve the quality of deposition of the conductive ink at the time of printing and improves conductivity of the tracks.

It is also ascertained that the component of the invention has mechanical tear strength greater than 2.5 daN, hence 25 kg·m·s$^{-2}$, a mechanical strength that conforms to and is even higher than required for the envisaged applications.

EXAMPLE 2: ILLUSTRATION OF THE ELECTRIC CHARGE BARRIER PROPERTY

Example 2 compares the characteristics between a glass fabric printed with a conductive ink on one side and coated with a polyurethane coating on the opposite side (component of the invention), and a glass fabric printed with a conductive ink and not coated on the opposite side (reference). In this example, it is the ink that is first deposited on the fabric.

In both cases, the deposited ink had a resistivity of 150 mOhm/sq/25 μm (mΩ/□/25 μm). The tracks were parallel lines of length 70 mm and pitch of 2.54 mm, the thickness of the printed ink was 100 μm. The inter-track distance was 3 mm. The number of printed lines was twelve.

The reference was a glass fabric having a thickness of about 128 μm.

The component of the invention comprised the same glass fabric as the reference. In addition, it was given a protective layer by coating with a polyurethane obtained from a PU elastomer having a modulus at 100% elongation of 2 MPa, with isocyanate+melamine formaldehyde crosslinker. The proportion of dry crosslinker relative to the dry elastomer was 8.4%. The polyurethane was applied in a 50:50 mixture of toluene and isopropanol. The PU was a one component aliphatic polycarbonate-based PU. Coating was performed using a doctor blade and was followed by drying in air then crosslinking at 180° C.

TABLE 2

| | Reference | Component of the invention, Example 2 |
|---|---|---|
| Type of yarn | Glass | Glass |
| Yarn titer (tex) | 68 | 68 |
| TPF (tex) | 0.17 | 0.17 |
| Diameter of a filament (μm) | 9 | 9 |
| Number of warp yarns × number of weft yarns (number/cm) | 11.8 × 11.5 | 11.8 × 11.5 |
| CF25 | 0.82 | 0.82 |
| Weight of coating on opposite side (g/m2) | 0 | 28 |
| PU modulus at 100% elongation (MPa) | NA | 2 |
| % crosslinker (by dry weight) | NA | 8.4 |
| Total weight (g/m2) | 121 | 149 |
| Mean electrical resistance of the twelve tracks in direct contact (right-side of fabric) (printed side) (Ohm) | 1.8 ± 0.2 | 1.8 ± 0.2 |
| Mean electrical resistance of the twelve tracks in indirect contact (wrong-side of fabric) (non-printed side) (Ohm) | 2.1 ± 0.2 | no signal detected |

The measurement obtained on the coated side of the fabric was zero, demonstrating the insulating and protective nature of the coating. It is therefore shown that the coating allows the contributing of a charge barrier property.

EXAMPLES 3 & 4; ILLUSTRATION OF LIGHTWEIGHT, HIGH MECHANICAL STRENGTH, HIGH DURABILITY AND BARRIER PROPERTIES IN PARTICULAR AGAINST OXYGEN IN AIR, HUMIDITY AND PRESENCE OF WATER

These examples compare the characteristics between polyamide fabrics coated with a polyurethane coating of the invention, and a non-coated polyamide fabric.

The reference is a PA6.6 fabric having a thickness of about 70 μm. The tenacity of the PA6.6 yarn is 6.6 cN/dtex. Elongation at break is 26%.

In Example 3, the same PA6.6 fabric was associated with a coated protective layer of polyurethane obtained from a PU elastomer having a modulus at 100% elongation of 2 MPa, with isocyanate+melamine formaldehyde crosslinker. The proportion of dry crosslinker relative to dry elastomer was 8.4%. The polyurethane was applied in a 50:50 mixture of toluene and isopropanol.

In Example 4, the same PA6.6 fabric was associated with a coated protective layer of polyurethane obtained from a PU elastomer having a modulus at 100% elongation of 32.4 MPa, and isocyanate+melamine formaldehyde crosslinker. The proportion of dry crosslinker relative to the dry elastomer was 79.4%. The polyurethane was applied in a 50:50 mixture of toluene and isopropanol.

In Examples 3 and 4, the PU was a one component aliphatic polycarbonate-based PU. Coating was obtained using a doctor blade and was followed by drying at 100° C., then crosslinking at 180° C.

TABLE 3

|  | Reference | Example 3 | Example 4 |
|---|---|---|---|
| Type of yarn | PA6.6 | PA6.6 | PA6.6 |
| Titer (dtex) | 33 | 33 | 33 |
| DPF (dtex) | 2.5 | 2.5 | 2.5 |
| Diameter of a filament (μm) | 19 | 19 | 19 |
| Number of warp yarns × weft yarns (number/cm) | 44 × 45 | 44 × 45 | 44 × 45 |
| CF25 | 0.79 | 0.79 | 0.79 |
| Weight of coating (g/m2) | 0 | 5.9 | 6.5 |
| PU modulus at 100% elongation (MPa) | NA | 2 | 32.4 |
| % crosslinker (by dry weight) | NA | 8.4 | 79.4 |
| Total weight (g/m2) | 33.0 | 38.7 | 38.9 |
| Mechanical tear strength in warp direction (daN) | 3.0 | 3.7 | 2.9 |
| Mechanical tear strength in weft direction (daN) | 2.3 | 4.2 | 2.7 |
| Permeability to air when new (L/m2/min) under 2000 Pa | >200 | 3 | 4 |
| Permeability to air after ageing (L/m2/min) under 2000 Pa | >200 | 48 | 52 |

It is ascertained that the components in Examples 3 and 4 of the invention have mechanical tear strengths greater than 2.5 daN, hence 25 kg·m·s$^{-2}$, a mechanical strength conforming to and even higher than needed for the envisaged applications.

It is ascertained that the components in Examples 3 and 4 of the invention have air and oxygen barrier properties when new and after ageing, of less than 150 L/m$^2$/min, a conforming air and oxygen permeability for the envisaged applications.

EXAMPLES 5 & 6: ILLUSTRATION OF PROPERTIES OF LIGHTWEIGHT, HIGH MECHANICAL STRENGTH, HIGH DURABILITY AND BARRIER PROPERTIES AGAINST OXYGEN IN AIR, HUMIDITY AND THE PRESENCE OF WATER

These examples compare the characteristics between printed polyester fabrics coated with a polyurethane coating of the invention, and a non-coated polyester fabric.

The reference is a PET fabric having a thickness of about 70 μm. The tenacity of the PET yarn is 6.8 cN/dtex. Elongation at break is 24.6%.

In Example 5, the same PET fabric was associated with a coated protective layer of polyurethane obtained from a PU elastomer having a modulus at 100% elongation of 2 MPa, and isocyanate+melamine formaldehyde crosslinker. The proportion of dry crosslinker relative to the dry elastomer was 8.4%. The polyurethane was applied in a 50:50 mixture of toluene and isopropanol.

In Example 6, the same PET fabric was associated with a coated protective layer of polyurethane obtained from a PU elastomer having a modulus at 100% elongation of 2 MPa, and isocyanate+melamine formaldehyde crosslinker. The proportion of dry crosslinker relative to the dry elastomer is 22.5%. The polyurethane was applied in 50:50 mixture of toluene and isopropanol.

In Examples 5 and 6, the PU was a one component aliphatic polycarbonate-based PU. Coating was performed using a doctor blade and was followed by drying at 100° C. then crosslinking at 180° C.

TABLE 4

|  | Reference | Example 5 | Example 6 |
|---|---|---|---|
| Type of yarn | PET | PET | PET |
| Yarn titer (dtex) | 33 | 33 | 44 |
| DPF (dtex) | 2.1 | 2.1 | 1.8 |
| Diameter of a filament (μm) | 16 | 16 | 16 |
| Number of warp yarns × weft yarns (number/cm) | 44 × 44.5 | 44 × 44.5 | 39 × 38.5 |
| CF25 | 0.79 | 0.79 | 0.82 |
| Weight of coating on opposite side (g/m2) | 0 | 8 | 14 |
| PU modulus at 100% elongation (MPa) | NA | 2 | 2 |
| % crosslinker (by dry weight) | NA | 8.4 | 22.5 |
| Total weight (g/m2) | 31.0 | 39.6 | 50.7 |
| Mechanical tear strength in warp direction d (daN) | 3.2 | 2.8 | 2.5 |
| Mechanical tear strength in weft direction (daN) | 2.7 | 2.6 | 1.8 |
| Permeability to air when new (L/m2/min) under 2000 Pa | >200 | 1 | 1 |
| Permeability to air after ageing (L/m2/min) under 2000 Pa | >200 | 4 | 2 |

It is ascertained that the components in Examples 5 and 6 of the invention have mechanical tear strengths greater than 1.5 daN, hence 15 kg·m·s$^{-2}$, a mechanical strength conforming to and even higher than required for the envisaged applications.

It is ascertained that the components in Examples 5 and 6 of the invention have air and oxygen barrier properties when new and after ageing that are largely lower than 150 L/m$^2$/min, a conforming air and oxygen permeability for the envisaged applications.

EXAMPLE 7: EVALUATION OF THE AGEING OF SCREEN PRINTED TEST PIECES—IMPACT OF CONDUCTIVE INK ON MECHANICAL PERFORMANCE AND IMPACT OF COATING ON INK CONDUCTIVITY

A PA6.6 fabric was used with PU coating conforming to Example 1 of the invention. Test pieces of conductive ink were printed by screen printing to obtain rectangles of 200×50 mm.

The test pieces were attached onto a metal plate, the PU coated side exposed to ageing and the side printed with conductive ink in contact with and therefore protected by the metal plate. Attachment was obtained using adhesive tape impervious to air and to water. The test pieces thus prepared were exposed in a climate chamber for 40 h to alternating cycles of 4 h exposure to UV and exposure to condensation under the following conditions:
- 4 h exposure to UV: UVA (340 nm), 60° C. and 20% relative humidity (RH)), and
- 4 h exposure to condensation: 40° C. and 100% RH.

Tensile tests in the warp direction and weft direction were conducted according to standard NF EN ISO 13934-1 as described supra, and measurements of electrical resistance were carried out following the method described supra. These measurements were taken on the following samples:
- 4 test pieces of coated fabric, denoted $T_e$
- 4 test pieces of coated fabric printed with conductive ink, denoted $T_{ei}$
- 4 test pieces of coated fabric printed with conductive ink, after ageing, denoted $T_{eiv}$
- 4 test pieces of non-coated fabric, denoted $T_{ne}$
- 4 test pieces of non-coated fabric printed with conductive ink, denoted $T_{nei}$
- 4 test pieces of non-coated fabric printed with conductive ink and after ageing, denoted $T_{neiv}$ The results are given in the table below:

|  | $T_e$ | | $T_{ei}$ | | $T_{eiv}$ | |
| --- | --- | --- | --- | --- | --- | --- |
|  | Mean | Stand. dev. | Mean | Stand. dev. | Mean | Stand. dev. |
| Ink thickness (μm) | NA | NA | 14 | 0 | 14 | 0 |
| Mechanical tear strength, warp direction (daN) | 4.0 | 0.1 | 4.5 | 0.1 | 4.3 | 0.2 |
| Mechanical tear strength, weft direction (daN) | 4.5 | 0.1 | 4.4 | 0.0 | 4.8 | 0.1 |
| Mean electrical resistance of test pieces in direct contact (right-side of fabric) (printed side) (Ohm) | NA | NA | 0.65 | 0.20 | 0.60 | 0.25 |

|  | $T_{ne}$ | | $T_{nei}$ | | $T_{neiv}$ | |
| --- | --- | --- | --- | --- | --- | --- |
|  | Moyenne | Stand. dev. | Mean | Stand. dev. | Mean | Stand. dev. |
| Ink thickness (μm) | NA | NA | 17 | 2 | 17 | 2 |
| Mechanical tear strength, warp direction (daN) | 3.9 | 0.1 | ND | ND | 3.6 | 0.5 |
| Mechanical tear strength, weft direction (daN) | 3.6 | 0.2 | ND | ND | 4.3 | 0.1 |
| Mean electrical resistance of test pieces in direct contact (right-side of fabric) (printed side) (Ohm) | NA | NA | 2.02 | 0.54 | 1.83 | 0.58 |

NA: not applicable;
ND: not determined

The results obtained therefore allow evidencing that:
- The mechanical strengths in the warp and weft directions are not impacted by the printing of conductive ink.
- Ageing does not impact the mechanical performance of the textile.
- These tests confirm the values given in Example 1, namely that the PU coating improves the mechanical strength of the fabric.
- Ageing does not modify the thickness of the samples.
- Better conductivity is observed in the presence of the coating, and stability thereof after ageing.

The invention claimed is:

1. A drapable electronic component, comprising:
   an electronic layer formed by printing ink, and
   a protective layer
   characterized in that:
   the protective layer forms a complex which comprises a fabric and a protective polymer layer coating one side of the fabric
   the electronic layer is deposited on the fabric, on the side of the fabric opposite the deposition side of the protective polymer layer
   the fabric is obtained by weaving continuous yarns and is characterized by a cover factor CF25 higher than or equal to 0.5, typically of 0.5 to 3, CF25 being calculated as follows: CF25=[(number of filaments/cm× diameter of 1 filament in cm)$_{warp}$+(number of filaments/cm×diameter of 1 filament in cm)$_{weft}$]×25/ thickness of said fabric in μm.

2. The component of claim 1, wherein the cover factor is between 0.6 and 2.5.

3. The component according to claim 1, wherein the fabric has a thickness of between 25 and 500 μm.

4. The component according to claim 1, wherein the fabric has an areal density of between 20 and 450 g/m$^2$.

5. The component according to claim 1, wherein the fabric is produced with synthetic yarns and the number of warp and weft yarns per centimetre is between 10 and 50 yarns/cm.

6. The component according to claim 1, wherein the fabric is produced with synthetic yarns having a linear density of between 11 and 800 dtex, and a linear density of the constituent filaments (DPF or decitex per filament) of between 1 and 4.

7. The component according to claim 6, wherein the synthetic yarns are made of polyamide or polyester.

8. The component according to claim 1, wherein the yarns are in inorganic material or in natural material and have a linear density of between 2 and 300 tex, and the linear density of the constituent filaments (TPF or tex per filament) is between 0.05 and 0.2.

9. The component according to claim 8, wherein the yarns are made of glass, basalt, cellulose or flax.

10. The component according to claim 1, wherein the dry take-up rate of the protective polymer is between 5 and 50%, the dry take-up rate being the ratio by weight of the dry protective polymer on the fabric.

11. The component according to claim 1, wherein the protective polymer is in the form of a coating which coats or impregnates the fabric.

12. The component according to claim 11, wherein the protective polymer comprises or is composed of a polymer selected from the group consisting of polyurethane, polyester, polycarbonate, polyether, polyethylene, polypropylene, polyvinyl alcohol, polyvinyl acetate, polyethylene vinyl acetate, poly(acrylate-methacrylate), polyvinyl chloride, synthetic rubber, silicone, and copolymers of these polymers.

13. The component according to claim 11, wherein the protective polymer is a polyether-, polyester- or polycarbonate-based polyurethane.

14. The component according to claim 13, wherein the polyurethane is derived from crosslinking (1) a one component polyurethane elastomer having a modulus at 100% elongation lower than or equal to 50 MPa, according to standard DIN 53504, performed in solvent phase (2) by a crosslinker, in a proportion of dry crosslinker relative to the dry elastomer of between 5% and 100% by weight.

15. The component according to claim 1, characterized in that the polymer is composed of a film laminated on the fabric.

16. The component according to claim 15, wherein said polymer comprises or is composed of a polymer selected from the group consisting of polyurethane, polyester, polycarbonate, polyether, polyethylene, polypropylene, polyvinyl chloride, polyvinyl fluoride, and poly(acrylate-methacrylate).

17. The component according to claim 1, wherein the fabric is a fabric obtained by weaving continuous PET yarns.

18. The component according to claim 1, wherein the component has a total weight of between 22 and 1400 g/m$^2$.

19. The component according to claim 1, wherein the ink is a conductive, semiconductor or dielectric ink.

20. The component according to claim 1, wherein the electronic circuit layer is coated with a second protective polymer layer.

21. The component according to claim 1, wherein said component forms a layer having resistive, capacitive or inductive effects; a sensor, actuator, antenna for data storage and transmission, for electromagnetic shielding; an optronic component; an electrically conductive track for the use or for contacting of electronic components; an electronic component in flexible photovoltaic films; an electronic component in flexible OLED applications.

22. The component according to claim 21, wherein said electrically conductive track is for the use or for contacting of LED, OLED, RFID or NFC.

23. A covering element comprising a drapable electronic component according to claim 1, said covering element being configured to cover a substrate or object at least in part.

24. An object having on its surface a drapable electronic component according to claim 1 applied onto a surface of the object with the electronic layer on the surface side.

* * * * *